(12) United States Patent
Tu et al.

(10) Patent No.: US 9,921,109 B2
(45) Date of Patent: *Mar. 20, 2018

(54) POLARIZATION-CHARACTERIZING METHODS USING PHASE-SHIFTING TARGETS

(71) Applicant: Benchmark Technologies, Lynnfield, MA (US)

(72) Inventors: Yuqiang Tu, Winchester, MA (US); Patrick Reynolds, Melrose, MA (US)

(73) Assignee: Benchmark Technologies, Lynnfield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/487,879

(22) Filed: Apr. 14, 2017

(65) Prior Publication Data
US 2017/0219435 A1    Aug. 3, 2017

Related U.S. Application Data

(63) Continuation of application No. 14/865,903, filed on Sep. 25, 2015, now Pat. No. 9,631,979.

(51) Int. Cl.
| | | |
|---|---|---|
| *G01N 21/00* | (2006.01) | |
| *G01J 4/04* | (2006.01) | |
| *G03F 7/20* | (2006.01) | |

(52) U.S. Cl.
CPC ............ *G01J 4/04* (2013.01); *G03F 7/70566* (2013.01)

(58) Field of Classification Search
CPC ..... G03F 1/36; G03F 1/54; G03F 1/60; G03F 1/92; G03F 7/70625; G01N 2021/95676
(Continued)

(56) References Cited

U.S. PATENT DOCUMENTS

| | | | |
|---|---|---|---|
| 5,300,786 A | 4/1994 | Brunner et al. | 250/548 |
| 5,756,238 A | 5/1998 | Barr et al. | 430/5 |

(Continued)

FOREIGN PATENT DOCUMENTS

WO    WO 2003/022506 A1    3/2003    ............ B23K 26/02

OTHER PUBLICATIONS

McIntyre et al., "PSM Polarimetry: Monitoring Polarization at 193nm High-NA and Immersion with Phase Shifting Masks," *Proceedings of SPIE*, vol. 5754, pp. 80-91 (2005).

(Continued)

*Primary Examiner* — Hoa Pham
(74) *Attorney, Agent, or Firm* — Sunstein Kann Murphy & Timbers LLP

(57) ABSTRACT

Methods for characterizing a beam parameter associated with an electromagnetic beam of a light source. The light source exposes a phase-shifted target through a set of focal distances relative to a focal plane of a substrate. At each focal distance of the set, registration values are measured and used to determine one or more registration slopes as a function of focal distance. The registration slopes are compared with baseline registration slopes to characterize the current relative state of the beam parameter in question. Beam parameters that may be characterized in this manner include degree of polarization and polarization rotation relative to an initial polarization direction. Phase shift test patterns advantageously used for beam characterization are described.

7 Claims, 8 Drawing Sheets

(58) Field of Classification Search
USPC ....... 356/401, 237.1–237.5; 430/5, 322, 311, 430/22; 355/67, 53, 77; 438/14
See application file for complete search history.

(56) References Cited

U.S. PATENT DOCUMENTS

| | | | |
|---|---|---|---|
| 5,936,738 | A | 8/1999 | Liebmann et al. ............ 356/401 |
| 6,011,611 | A | 1/2000 | Nomura et al. ................ 355/67 |
| 6,249,335 | B1 | 6/2001 | Hirukawa et al. ............. 355/53 |
| 6,355,382 | B1 | 3/2002 | Yasuzato et al. ................ 430/5 |
| 6,535,280 | B1 | 3/2003 | La Fontaine et al. ........ 356/123 |
| 6,674,511 | B2 | 1/2004 | Nomura et al. ................ 355/55 |
| 6,811,939 | B2 | 11/2004 | Nakao et al. .................. 430/30 |
| 7,224,458 | B2 | 5/2007 | McIntyre et al. ............. 356/364 |
| 7,564,553 | B2 | 7/2009 | Nomura ........................ 356/364 |
| 8,368,890 | B2 | 2/2013 | Brunner et al. ............. 356/367 |
| 8,679,708 | B2 | 3/2014 | Brunner et al. ................. 430/5 |
| 9,631,979 | B2 * | 4/2017 | Tu ............................. G01J 4/04 |
| 2008/0304029 | A1 | 12/2008 | Pforr et al. ..................... 355/44 |
| 2016/0161863 | A1 * | 6/2016 | Den Boef ............. G01B 11/24 355/67 |

OTHER PUBLICATIONS

Tu et al., "Resist-based Polarization Monitoring for 193nm High-Numerical Aperture Lithography," *SPIE* 7140-44, Lithography Asia, 10 pages (2008).

Ki Yun Cho, Authorized officer Korean Intellectual Property Office, International Search Report—International Application No. PCT/US2016/051494, 14 pages, dated Jan. 17, 2017 together with the Written Opinion of the International Searching Authority.

* cited by examiner

POLARIZATION-CHARACTERIZING METHODS USING PHASE-SHIFTING TARGETS

The present application is a continuation application of U.S. patent application Ser. No. 14/865,903, filed Sep. 25, 2015, and issued Apr. 25, 2017 as U.S. Pat. No. 9,631,979, which is incorporated herein by reference.

TECHNICAL FIELD

The present invention relates to methods for characterizing properties of electromagnetic beams used for exposure equipment, and more particularly, for monitoring focus and for tracking drift in the state of polarization.

BACKGROUND ART

As semiconductor fabrication strides toward features of ever smaller dimensions, the requisite resolution tolerances of processing steps become more stringent apace. Technology is near the point at which prior art methods no longer suffice to the task.

As background, salient components of a prior art lithographic projection system, designated generally by numeral 100, to which the present invention is applicable, are now described with reference to FIG. 1. Lithographic projection system 100, in its entirety, may be referred to herein, synonymously, as a "lithographic tool," a "microlithographical tool," or as a "litho tool." Lithographic projection system 100 is used for fabrication of integrated circuits using CMOS (complementary metal-oxide-semiconductor) or kindred lithographic technologies.

During the course of operation of lithographic projection system 100, wafers 105, or other substrates, are successively stepped by motion of wafer stage 107 such that a portion, or all, of a wafer substrate 105 falls within an intense electromagnetic beam 109, which may be referred to herein simply as beam 109. Beam 109 is generated by illumination source (or "light source," or "source") 101 of the lithographic projection system 100, where illumination source 101 is a source of substantially monochromatic radiation such as an excimer laser, or other laser, or other deep ultraviolet (DUV) source, although the wavelength range of source 101 is not limited, for purposes of the present description and claims, and source 101 may also be an x-ray source, or a source in the extreme ultraviolet (EUV), all within the scope of the present invention.

Electromagnetic radiation 110 emitted by source 101 may be referred to herein as "light," without loss of generality, understanding that the term "light" similarly encompasses x-rays and other electromagnetic radiation. An aperture 112 and condenser lens system 114 define the étendue of the projection system 100, while reduction lens system 118 defines the numerical aperture (NA) of beam 109 focused on or near wafer substrate 105. A photomask 116 (which may be also referred to herein as a "reticle"), is interposed between condenser lens system 114 and reduction lens system 118, and includes one or more patterns or targets 120 defined on its surface. Reticle 116, containing a die or an array of dies, is projected onto wafer substrate 105, which is then stepped for subsequent repetition of the projection pattern onto the wafer. Reticle 116 typically comprises chromium patterns on a quartz plate, generally called chrome-on-glass (COG) technology. Projection system 100 is characterized by an optical axis 180 (shown in FIG. 1) that defines the direction of propagation of electromagnetic beam 110 and that is transverse to wafer substrate 105.

FIG. 2 shows a prior art immersion scanner projection system, designated generally by numeral 200. Immersion scanner projection system 200 is a particular case of projection system 100, and contains identical components, other than that the space between condenser lens system 118 and wafer substrate 105 contains a fluid 205, typically water, allowing higher numerical apertures, and thus tighter focus and higher feature resolution, to be achieved.

Using either the dry scanner of lithographic projection system 100 or the immersion scanner projection system 200, beam 109 serves to pattern openings in a photoresistive polymer deposited on wafer substrate 105. When the photoresistive polymer is developed and rinsed, an indicated etch, deposit or implanting of material may be made onto, or into, the wafer substrate.

It is critical that the pattern encoded in the photomask 116 be accurately focused at a specified plane relative to wafer stage 107. As successive layers are built up through a series of deposition steps, the optimum focal plane rises to a successively higher position of the photoresist above the base of wafer substrate 105 at wafer stage 107. Thus the location of the focus of beam 109 must be known to a degree of accuracy commensurate with the focal depth of the beam. Various phenomena such as non-flatness of the ensemble of wafer substrates 105, or resist thickness variations, may give rise to effective changes of focus, which must be tracked and cured to achieve optimal feature resolution.

In order to quantify any focus offset, prior art practice has taught techniques whereby a phase-shifting mask structure provides for monitoring focus. Such a prior art phase-shifting mask structure 300 is shown in FIG. 3A and is described in U.S. Pat. No. 5,300,786 (to Brunner et al., hereinafter "Brunner '786"), which is incorporated herein by reference in its entirety. Phase-shifting mask structure 300, as applied for monitoring focus, may be referred to as a Phase Shift Focus Monitor, or "PSFM." Prior art phase-shifting mask structure 300 has a configuration of opaque line segments 304 that are either horizontal or vertical in the plane of a surface of a substrate 302, where the substrate is a transparent material such as quartz. In the prior art embodiment of FIG. 3A, opaque line segments 304 (or "shield lines") do not intersect with one another. The prior art phase-shifting mask structure 300 has phase shift windows 306 where the optical depth through the window, $\int n(z)dz$, where z is the coordinate into the plane of the surface of substrate 302, and n(z) is the index of refraction, differs from the optical depth through a non-phase shifted zone 308 of substrate 302, typically by an amount corresponding to a fraction of a wavelength of electromagnetic radiation 110.

In the prior art phase-shifting mask structure 300, phase-shifted windows 306 are rectangular, and either adjacent or non-adjacent, and triangular. By projecting prior art phase-shifting mask structure 300 onto surface 106 of wafer substrate 105 (shown in FIG. 1), a (reduced) image 340 is formed as shown in FIG. 3B. Surface 106 may also be referred to herein as the "plane of the projected image" since it is the focal plane of the optical system of which the reticle is placed in the object plane. Measurement of displacement between an inner "square" 342 and an outer "square" 344 yields an "overlay" that, once calibrated, provides a measure of litho tool focus.

Other configurations of phase shift test patterns have been taught in the art, such as that shown in FIG. 3C (originally FIG. 8 of Brunner '786). In the prior art embodiment shown in FIG. 3C, an outer square 351 of shield lines 304 functions as a control to confirm the extent and direction of line shift resulting from a phase shift region 358 between a middle square 353 and an inner square 355 of shield lines 304.

A problem arising in the prior art phase shift test patterns is that of the appearance of a ghost image, described with reference to FIGS. 4A-4C, which show the resultant projection image 360 resulting from projection of the phase-shifting mask structure 300 shown in FIG. 3A under conditions of successively lower illumination dose. As the dose decreases, ghost image (GI) 362 appears as a line along the diagonal edge of phase-shifted region 309 (shown in FIG. 3A). Ghost image 362 confounds the determination of overlay and thus of defocus. Ghost images are particularly problematic when immersion tools are used.

It would thus be desirable to provide a reticle that allows for more accurate and robust determination of focus. Moreover, it would be desirable to monitor other characteristics of the lithographic projection system 100 by means of a projected reticle. In particular, monitoring the polarization state of a high-NA immersion scanner has become more and more important as technology moves into, and beyond, 32-nm illumination. Previously suggested resist-based technologies for monitoring source polarization all require specially designed reticles, each of which contains multiple polarimeters, and also require a wide dose range, exceeding 300 mJ/cm$^2$, and many scanning electron microscope (SEM) images, in order to obtain satisfactory measurements of source polarization. These include those of McIntyre et al., "*PSM Polarimetry: Monitoring Polarization at 193 nm High-NA and Immersion with Phase Shifting Masks,*" J. Microlithography, Microfabrication, and Microsystems, vol. 4, 031102 (2005), and Tu et al., "*Resist-based Polarization Monitoring for 193 nm High-Numerical Aperture Lithography,*" Proc. SPIE 7140, Lithography Asia 2008, 714019 (2008), and U.S. Pat. No. 8,679,708 (to Brunner et al.), all of which references are incorporated herein by reference in their entirety. It would, thus, be desirable to monitor the polarization state of a high-NA immersion scanner using a single target used also for focus monitoring.

SUMMARY OF THE EMBODIMENTS

In accordance with an aspect of the present invention, a method is provided for characterizing a beam parameter associated with an electromagnetic beam of a light source. The method has steps of:
  using the light source to expose a phase-shifted target through a set of focal distances relative to a focal plane of a substrate;
  at each focal distance of the set, determining an x-registration value and a y-registration value;
  using the x-registration value and the y-registration value at each focal distance to determine an x-registration slope and a y-registration slope as a function of focal distance; and
  comparing the x-registration slope and the y-registration slope with a baseline x-registration slope and a baseline y-registration slope, respectively, to characterize a relative value of the beam parameter.

In accordance with other embodiments, the beam parameter may be a relative degree of polarization, and the polarization may be linear. The beam parameter may be chosen from a group of beam parameters including degree of polarization, polarization rotation, orientation of an optical axis, and number of active space transverse modes.

In yet further embodiments of the invention, the source may be a laser, or an EUV source, and may be incorporated within a lithography tool.

BRIEF DESCRIPTION OF THE DRAWINGS

The foregoing features of the various embodiments of the present invention will be more readily understood by reference to the following detailed description, taken with reference to the accompanying drawings, in which.

DETAILED DESCRIPTION OF SPECIFIC EMBODIMENTS

Figure 1:
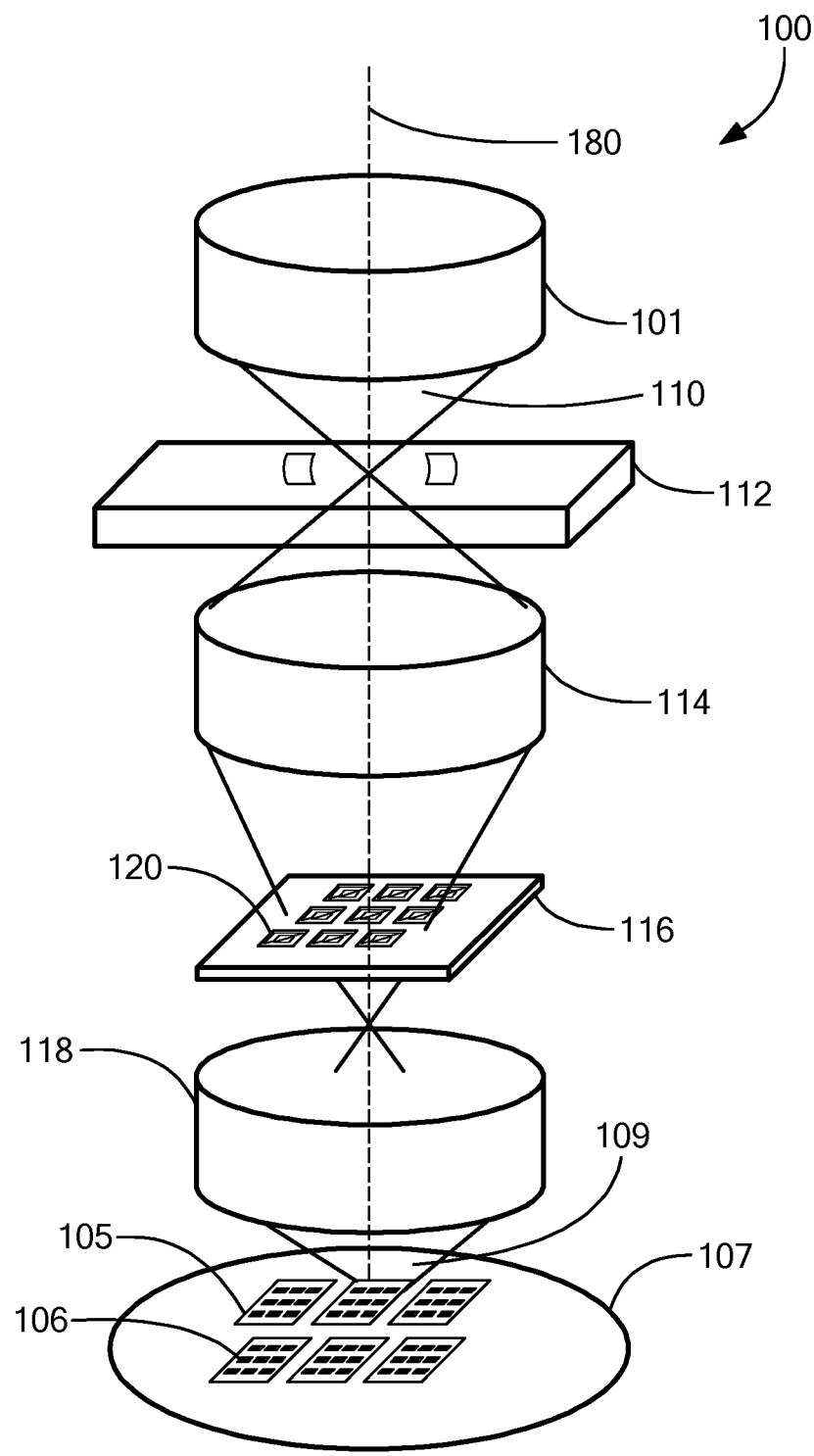
FIG. 1 shows a lithographic projection system known in the prior art.
Figure 2:
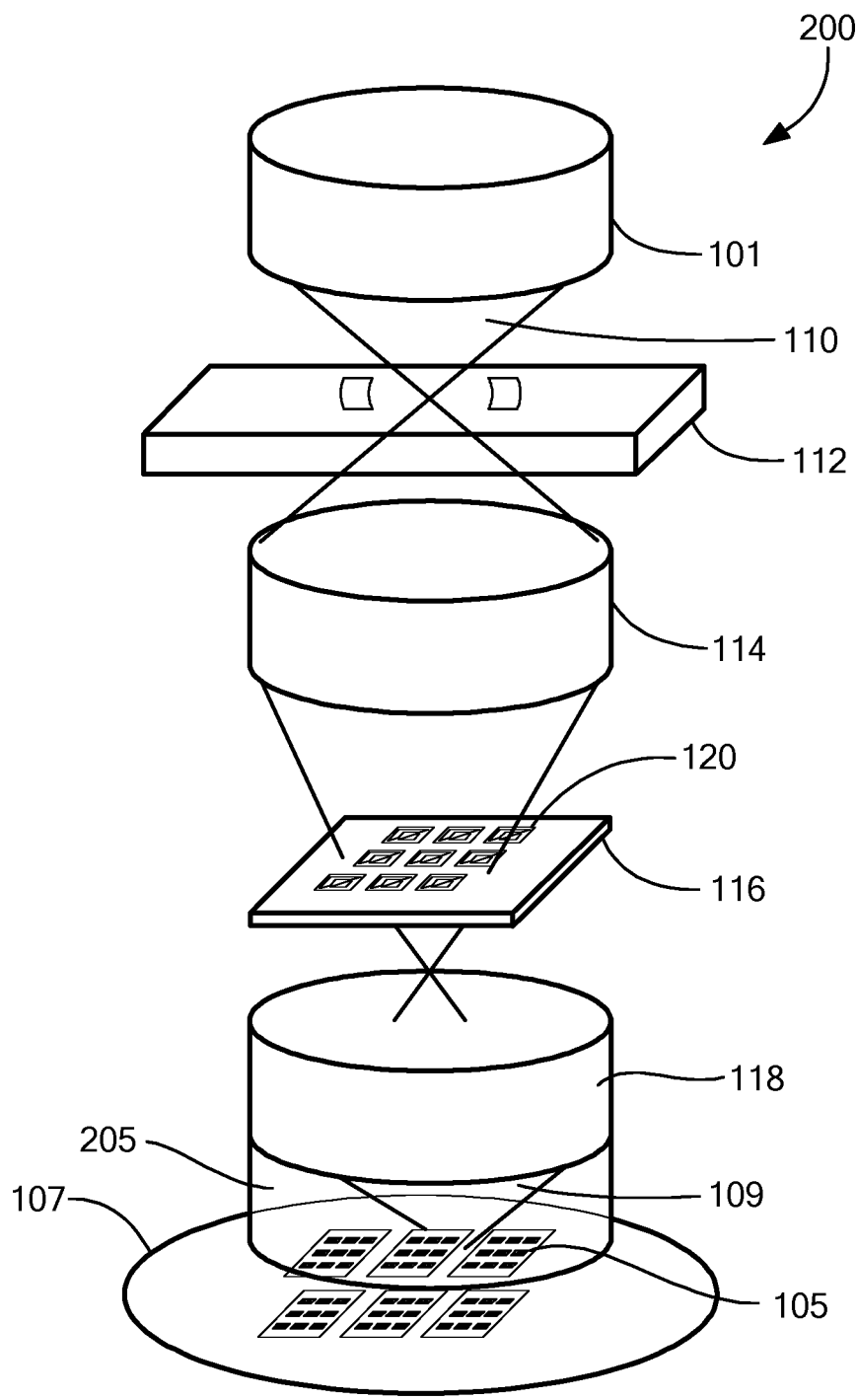
FIG. 2 shows a lithographic immersion scanner projection system known in the prior art.

Definitions. As used in this description and the accompanying claims, the following terms shall have the meanings indicated, unless the context otherwise requires:

The term "light" shall refer to any electromagnetic radiation, regardless of frequency, and encompasses deep ultraviolet (DUV), x-ray radiation, and extreme ultraviolet (EUV). Similarly, an "electromagnetic beam" is a beam of "light" as understood in the definition of the preceding sentence.

The term "source," with or without the qualifier "light," shall denote the modality for generating a beam of light. It may be a laser, or any other device suited to generate light with properties requisite for a specified application.

The term "target" shall refer to any substrate, having a pattern of substantially transparent regions and opaque line segments, that is placed within a beam of light. A "target" is sometimes referred to herein as a "pattern" or as a "photomask structure." A "phase-shifting photomask structure" is a target wherein the substantially transparent regions have a characteristic optical depth at the wavelength of the beam of light, and the opaque line segments define one or more regions having an optical depth different from the characteristic optical depth by a fraction less than one wavelength of the beam of light.

A "reticle," as the term is used herein, is synonymous with the term "photomask," and refers to a set of targets on a single substrate, where the set includes at least one target.

An "enclosed region" is an area defined by a boundary that is "compact" in a mathematical sense, which is to say that for any infinity of points sampled within the region, some subset of those points must get arbitrarily close either to a point within the region or to a point on the boundary. As a practical matter, an enclosed region has no holes inside it.

A polygon shall be said to "enclose" a region in two dimensions when it forms the boundary of an "enclosed region."

"Optical depth" is the integral of an index of refraction over a specified path.

An "enclosed optical depth" shall refer to an optical depth characterizing an "enclosed region."

As used herein, the term "substrate" shall mean any physical medium with a substantially planar upper surface upon which a semiconductor device is applied. Thus, for example, a substrate may be a wafer, or a detector, a focal array of a CCD camera, etc.

As used in this description and in the appended claims, the term "image" refers to any multidimensional representation, whether in tangible or otherwise perceptible form or otherwise, whereby a value of some characteristic is associated with each of a plurality of locations corresponding to dimensional coordinates of an object in physical space, though not necessarily mapped one-to-one thereonto. Thus, for example, the graphic display of the spatial distribution of some feature, such as polarization state, in one or more colors constitutes an image. So, also, does an array of numbers in a computer memory or holographic medium. Similarly, "imaging" refers to the rendering of a stated physical characteristic in terms of one or more images.

The "degree of polarization" expresses the ratio of light in a beam that is linearly polarized in one direction as a fraction of the total light intensity in the beam, and varies between values of 0 and 1.

The word "relative," as applied to a parameter, such as a degree of polarization, for example, signifies that a measurement may be made, or that a value may be specified, in relation to another instance of the same parameter rather than in absolute terms. In a similar vein, "polarization rotation" may be derived relative to a fiducial polarization direction as initially set.

A problem posed in projection lithography is now described with reference to FIGS. 5 and 6, where x calibration curve 501 and y calibration curve 503 plots measured overlays (in microns) as a function of focus change (in microns) as the focus is scanned through surface 106 in a series of points 505. The x calibration curve 501 corresponds to a measured overlay (referred to herein as an x-registration value) in one direction (defined as the $\hat{x}$ direction) within the plane of a projected image 106, while the y calibration curve 503 corresponds to the measured overlay (referred to herein as a y-registration value) in a direction (defined as the $\hat{y}$ direction) that is orthogonal to the $\hat{x}$ direction. In the case shown in FIG. 5, unpolarized illumination is employed, which leads to slopes of the x calibration curve 501 and the y calibration curve 503 that are substantially equal in magnitude (and either of the same or opposite sign). Slopes of the x calibration curve 501 and the y calibration curve 503 may be referred to herein as "phase shift target (PST) slopes" or as "phase shift focus monitor (PSFM) slopes."

Figure 5:
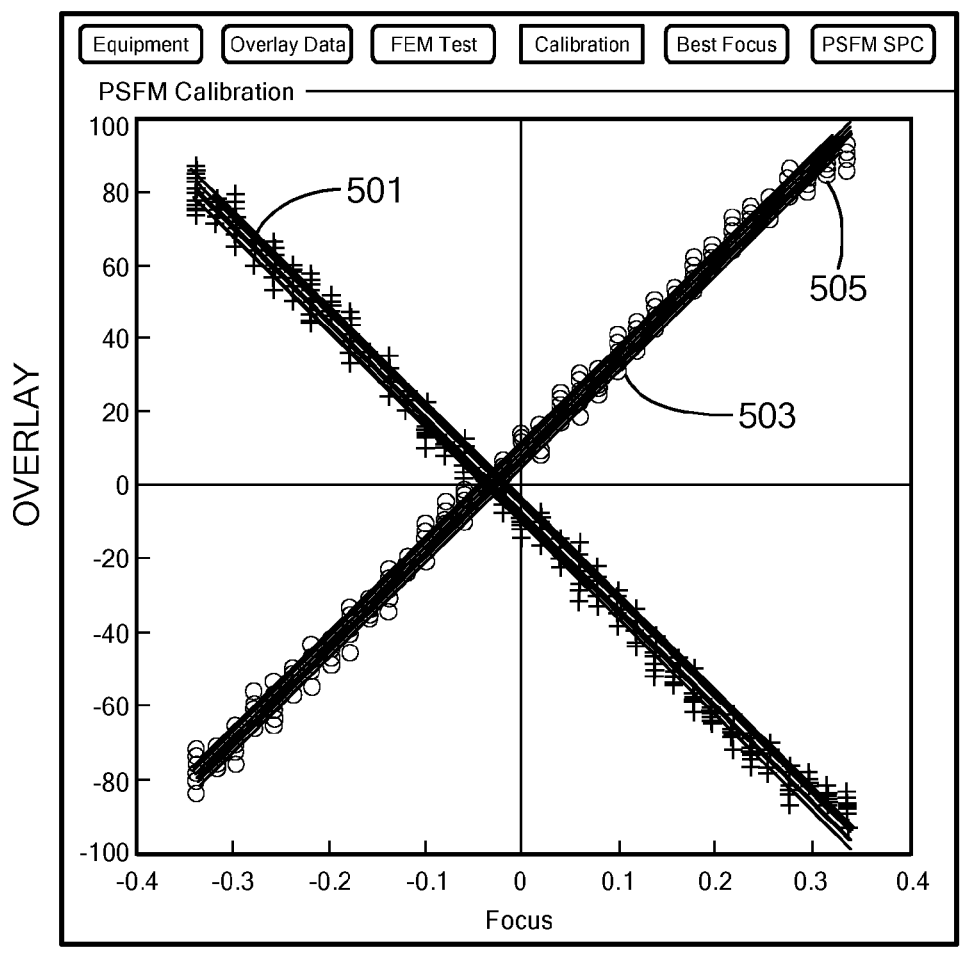
FIG. 5 is a plot of PSFM overlay in x and y directions as the focus is varied in a lithographic projection system with an unpolarized light source.
Figure 6A:
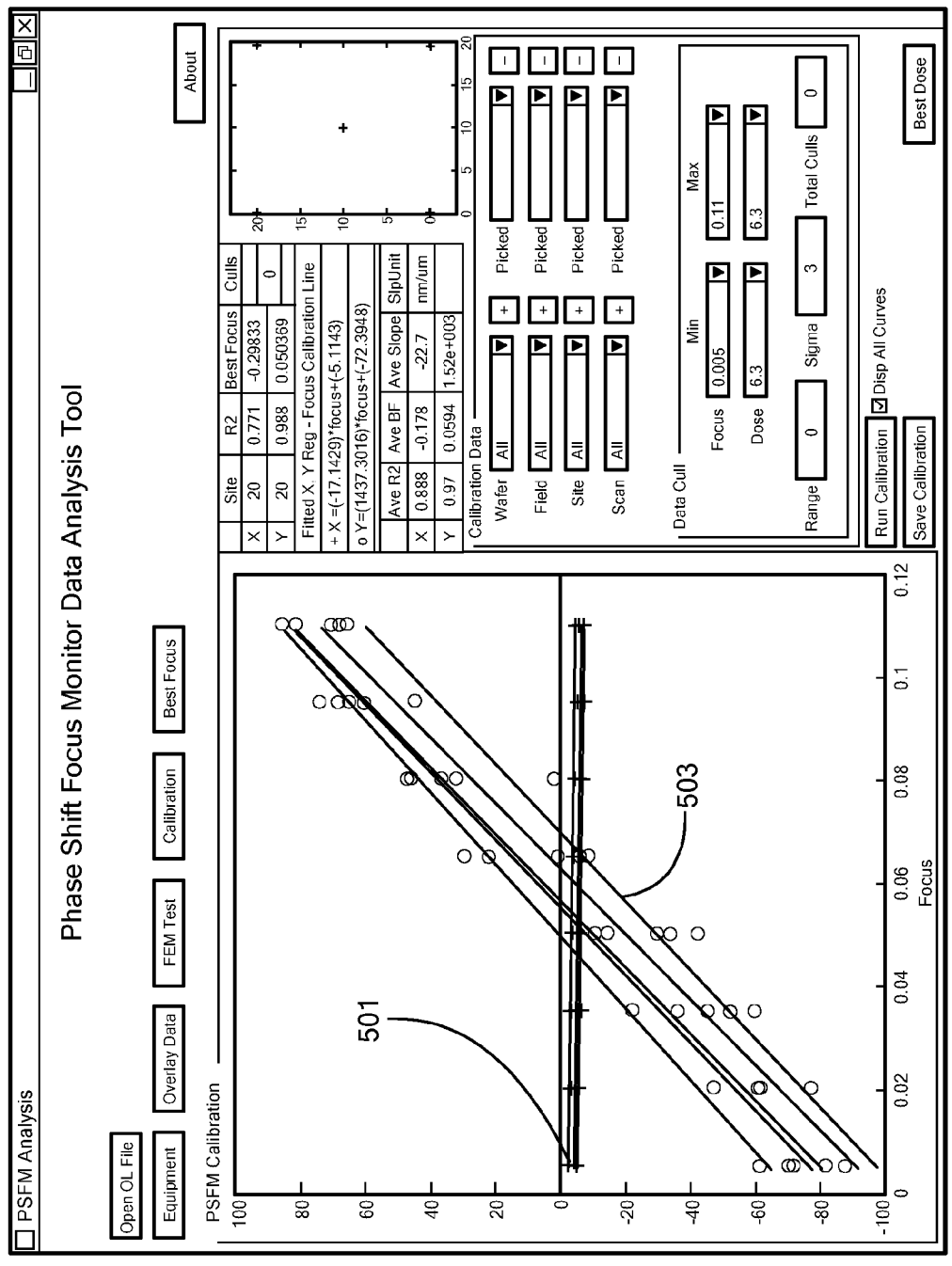
FIG. 6A shows a screen shot depicting different PSFM slopes in the x and y directions under conditions of a polarized incident beam.

The x calibration curve 501 and the y calibration curve 503 shown in FIG. 5 are substantially linear, and, thus, characterized by substantially constant slopes, indicating favorable linearity of the focus measurement system. The slopes corresponding to the x-registration values as a function of focal distance may be referred to herein as an x-registration slope, and, mutatis mutandis, the y-registration values provide the y-registration slope.

Figure 6B:
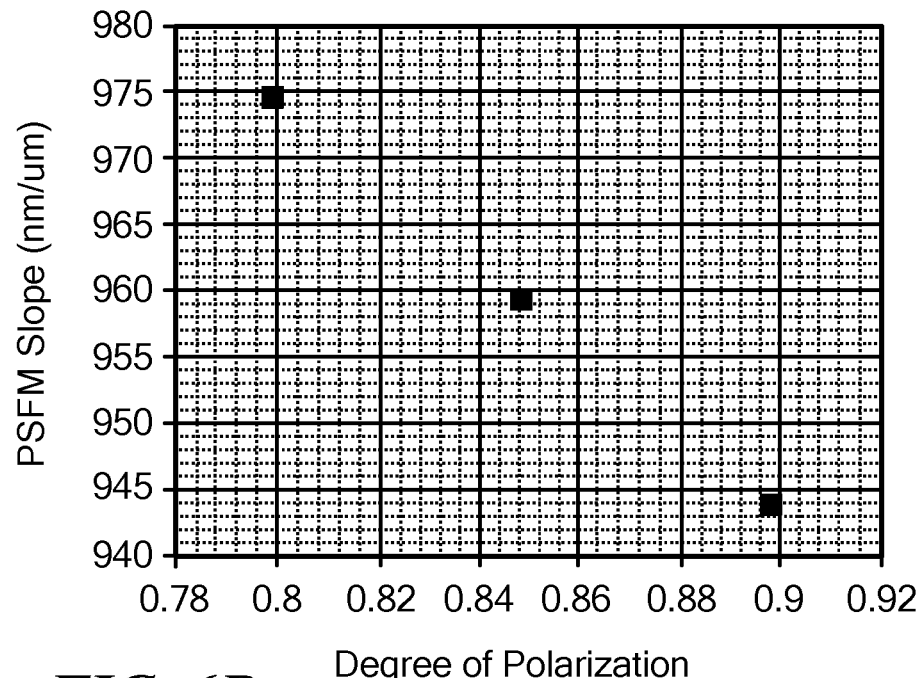
FIGS. 6B and 6C respectively plot the PSFM slope, described below, with variation in the degree of polarization and change in polarization angle of an incident beam, in accordance with an embodiment of the present invention.
Figure 6C:
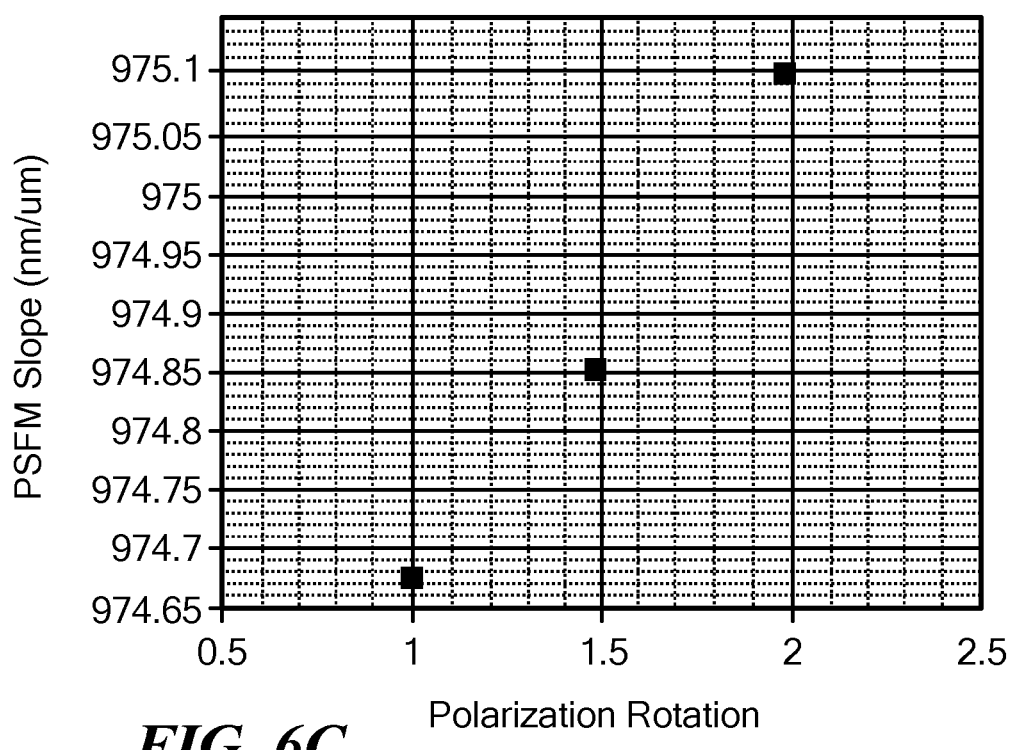

The present inventors have found, however, that when illumination source 101 is linearly polarized, the slopes of the x calibration curve 501 and the y calibration curve 503 (shown in the screenshot of FIG. 6A for several orientations of polarization) may no longer be equal in magnitude. One result is that a drift in polarization of illumination source 101 over time—as over the course of a production run, for example—will lead to a mistaken inference of focus, since the focus calibration curve is evidently polarization-sensitive. Sensitivity to both the degree of polarization (the ratio of light in a beam that is linearly polarized in one direction as a fraction of the total light intensity in the beam) and the angle of polarization relative to a fiducial direction are shown, respectively, in FIGS. 6B and 6C. FIG. 6B plots the PSFM slope (in nm/μm) in one direction as the degree of polarization varies between 80% and 90%. FIG. 6C plots the PSFM slope (in nm/μm) in one direction as the polarization angle of the incident electromagnetic radiation 110. FIGS. 6B and 6C demonstrate that the degree of polarization and the polarization rotation may be calibrated against PSFM slope.

Use can thus be made of the x-y asymmetry of slope to monitor the polarization state of illumination source 101 in a manner that may advantageously be independent of dose, focus, and litho tool. Additionally, methods for monitoring beam parameters in accordance with embodiments of the present invention, as described in detail below, may be advantageously fast, easy to implement, and cost effective, in that they may be implemented in the context of existing projection lithographic tools.

Examples of new target patterns, in accordance with embodiments of the present invention, that may be employed for characterizing focus and other beam parameters, as taught herein, are now described with reference to FIGS. 7A and 7B. New phase-shifting mask structures are designated generally by numerals 700 and 701 in FIGS. 7A and 7B, respectively. PSM structure 700 may also be referred to herein synonymously as a "phase shift target" (PST). Opaque lines 706, typically chrome or other metal, are deposited onto a transparent substrate such as quartz. Within the scope of the present invention, fabrication of any features of the PSM may be by deposition or implanting, and, in either case, may be referred to, herein, as lying "upon" the planar surface of the photomask substrate 116 (shown in FIG. 1). Opaque linear segments 706 are configured as polygons, where a "polygon" is a closed figure in a plane consisting of adjoining straight line segments, which may also be referred to as "linear segments. One polygon 720 is highlighted in FIG. 7A, by way of example.

Polygons in the PSM structures 700 and 701 include L-shaped hexagons such as polygon 720 as well as triangles, although it should be understood that other polygons may also be used within the scope of the present invention. Each polygon 720 encloses an enclosed region 702, 704 of photomask substrate 116. Some, but not all, of the enclosed regions, shown in FIGS. 7A and 7B as shaded, are characterized by an optical depth, referred to herein as an "enclosed optical depth," which is different from the characteristic optical depth of the substrate. Enclosed region 702 is such a region with a distinct, phase-shifted, optical depth. The optical depth of such a region may be greater or less than the optical depth characterizing the rest of the substrate, by an amount less than one wavelength of the incident light 110, thereby causing a phase shift of light 110 traversing the PSM by a fixed phase amount less than 360° of phase. Enclosed region 704 is an example of a region of unshifted phase.

Figure 3A:
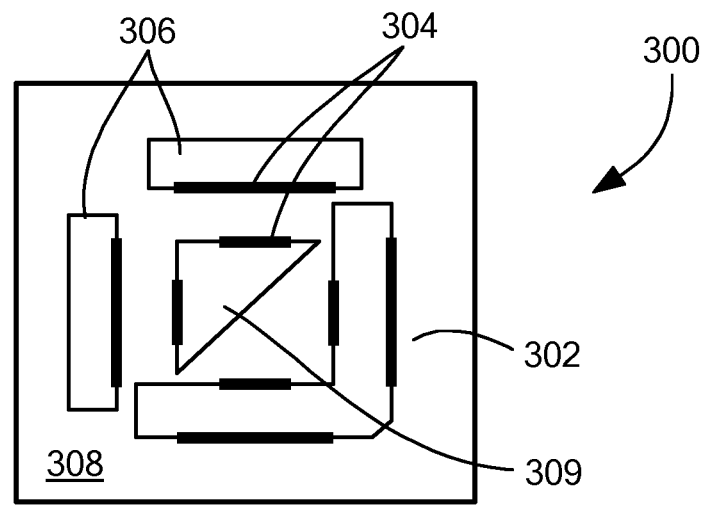
FIG. 3A is a schematic view from above of a prior art phase-shifting mask structure.
Figure 3B:
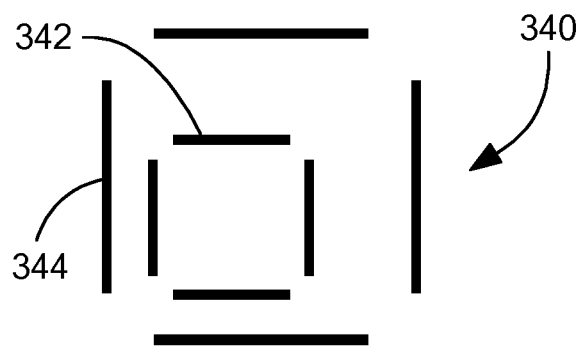
FIG. 3B depicts a projected image of the prior art phase-shifting mask structure of FIG. 3A under a defocus condition.
Figure 3C:
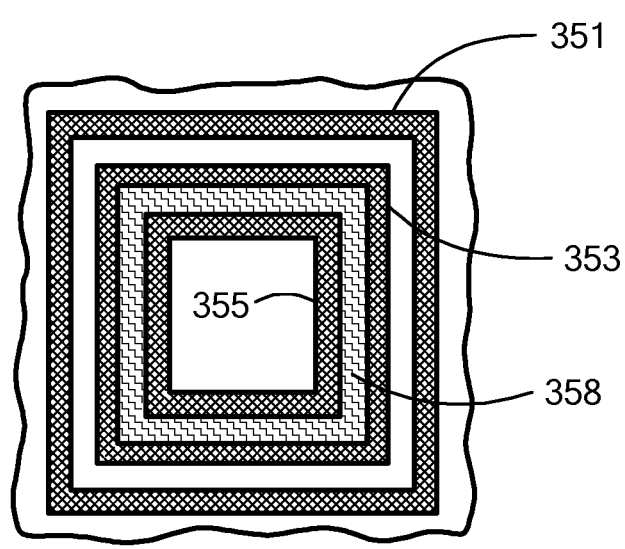
FIG. 3C is a schematic view from above of another prior art phase-shifting mask structure.
Figure 4A:
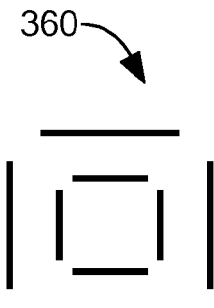
FIGS. 4A-4C show increasing prominence of a confounding ghost image as illumination dose is decreased in the prior art.
Figure 4B:
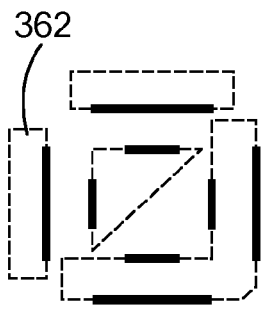
Figure 4C:
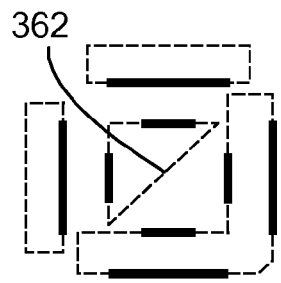

In PSM structures 700 and 701, polygons enclosing regions 702 and 708 that are characterized by substantially the same optical depth intersect each other at two points at most, namely at points 710 and 711. "Points," as the term is used in reference to the intersection of line segments, are of the size characterizing the intersection of the line segments. This structure advantageously does not form a closed loop or pattern, and is thus overlay-measurement ready in a manner unavailable in the prior art PSM designs such as those of FIG. 3C.

In PSM structure 700, an opaque linear segment 731 of a first polygon enclosing region 702 and an opaque linear segment 732 of a second polygon enclosing region 704 are each parallel to a specified axis 735, while other opaque linear segments may be orthogonal to the specified axis 735, or diagonal. PSM structures 700 and 701 may be advantageously devoid of ghost images when projected onto wafer surface 105, thereby enhancing the accuracy of overlay measurements and focal offset determinations.

Figure 7A:
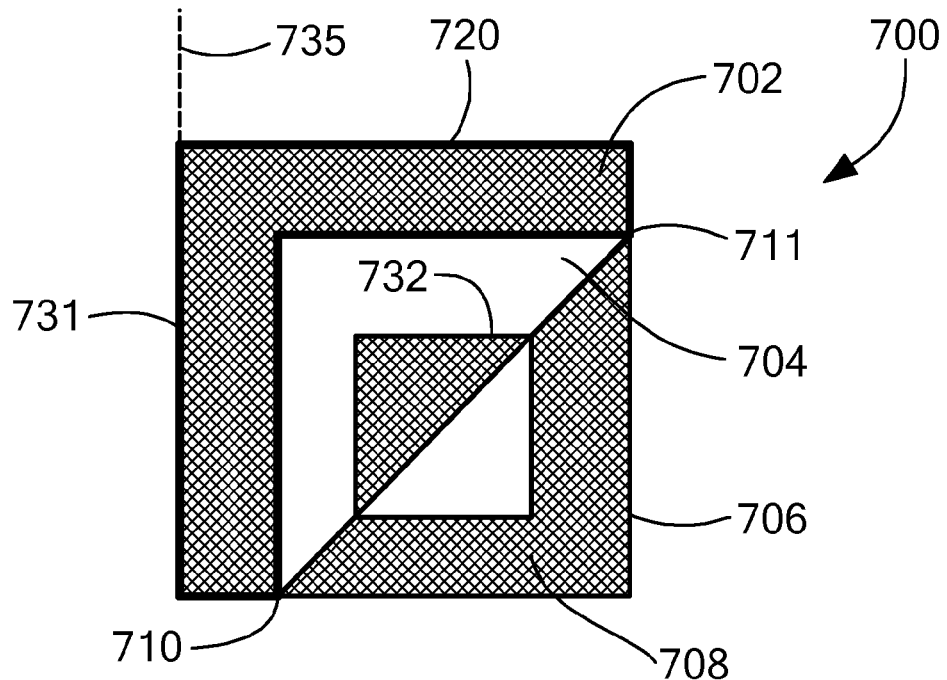
FIGS. 7A and 7B are schematic views from above of novel phase-shifting mask structures in accordance with embodiments of the present invention.
Figure 7B:
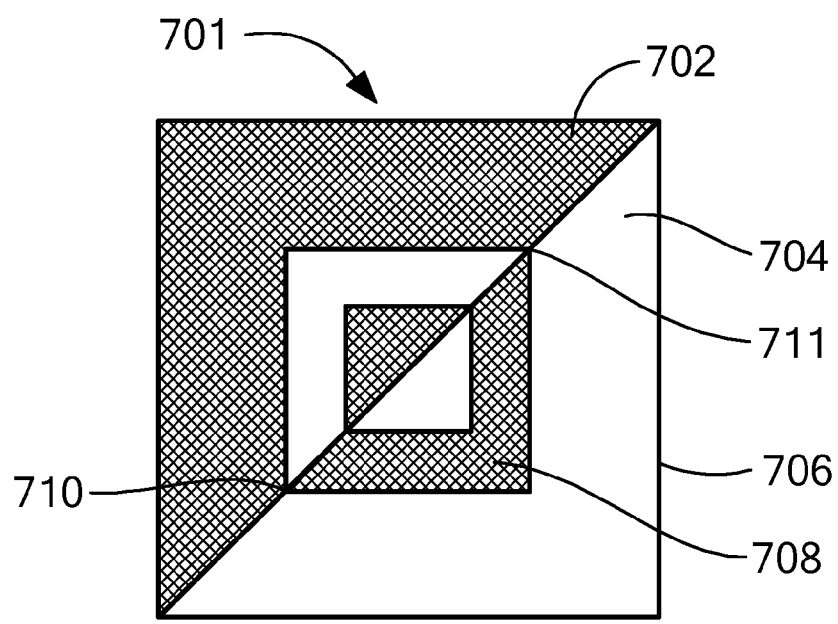

Using a PSM structure 700 such as one shown in FIGS. 7A and 7B by way of example, resist-based, and overlay-metrology-measureable, methods are provided, in accordance with embodiments of the present invention, for monitoring the drift of beam parameters that characterize beam 109 (shown in FIG. 1). The polarization state of beam 109 is one example of a beam parameter that may be monitored in accordance with methods described herein, and further description will proceed in terms of the degree of polarization of beam 109. However, it is to be understood that any description in terms of beam polarization is without loss of generality, and may be applied to other beam parameters. Other parameters and characteristics of beam 109 that may be characterized in an analogous fashion include the polarization direction of beam 109, orientation of the optical axis 180 relative to the plane of wafer stage 107, and the number of active space transverse modes, effecting the output beam pattern of illumination source 101, as discussed, for example, in U.S. Pat. No. 5,596,596, which is incorporated herein by reference in its entirety. Since the polarization direction, as well as the number of active space transverse modes or the output beam propagation direction, may wander slightly over time, the presently described method may advantageously be employed to monitor system stability.

Figure 8:
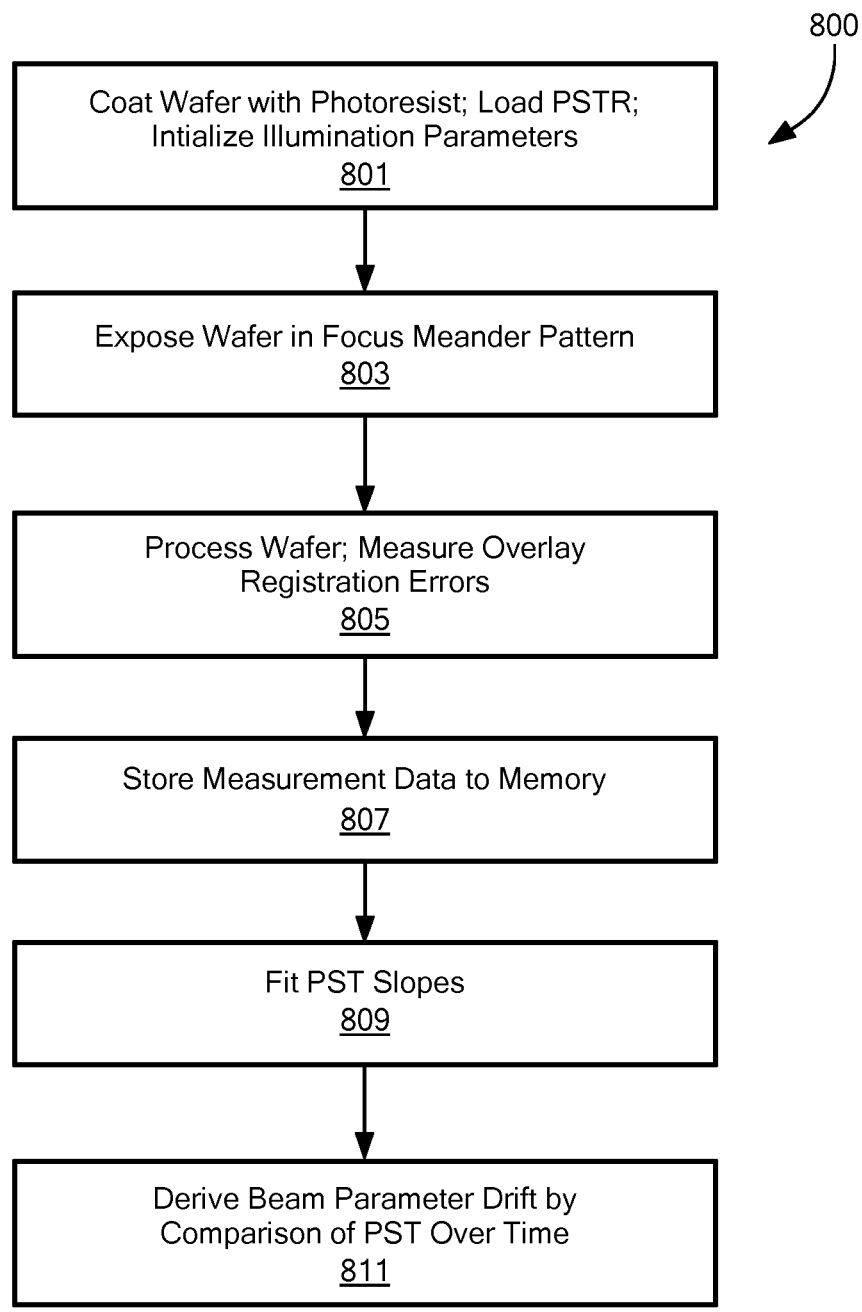
FIG. 8 is a flowchart depicting steps performed in a method for monitoring drift of a beam parameter in a lithographic projection system, in accordance with an embodiment of the present invention.

A monitoring procedure 800 using phase shift target reticle (PSTR) in accordance with an embodiment of the present invention is now described with reference to flowchart of FIG. 8.

In a first step 801, a wafer (typically silicon) is coated with photoresist and a PTSR 700 (shown in FIG. 7A) is loaded onto a lithographic tool 100 (shown in FIG. 1). The litho tool illumination parameters are set, including the NA of reduction lens system 118, sigma (the ratio of condenser NA to objective NA, or, effectively, the fill factor, or partial coherence factor), the polarization mode, etc.

Then, the wafer is exposed (in step 803) at a series of focal distances, i.e., shot by shot, in a focus meander manner. For example, starting from a negative focus setting of −0.5 µm, a shot is made on the wafer, then, moving to the next location on the wafer, the focus is set at −0.4 µm, then stepped to 0.1 um for the next exposure. Wafer exposure is continued in this manner until the focus reaches +0.5 µm, or any other specified focal setting.

In a further step 805, standard post exposure processing of the wafer is performed, including developing, post-exposure baking, etc. The wafer is loaded on an overlay metrology tool, such as an Archer™ 500 available from KLA-Tencor Corporation of Milpitas, Calif. The overlay metrology tool is used to measure the overlay registration errors caused by the focus offsets on the phase shift targets. Overlay data files containing these overlay registration errors are stored to memory (in step 807) and become available after the measurement has been completed.

Data analysis software is used to parse the overlay data file and to fit (in step 809) a linear curve of overlay vs. focus. The PST slopes of these fitted curves 501, 503 (shown in FIG. 5) become available. The PST slopes are compared (in step 811) to previous ones including baseline slopes to monitor any polarization state drifts. Statistical process control (SPC) charts may be employed, as may any other data bases or plots, to track the changes of PST slopes, within the scope of the present invention.

The present invention may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof Computer program logic implementing all or part of the functionality previously described herein may be embodied in various forms, including, but in no way limited to, a source code form, a computer executable form, and various intermediate forms (e.g., forms generated by an assembler, compiler, networker, or locator). Source code may include a series of computer program instructions implemented in any of various programming languages (e.g., an object code, an assembly language, or a high-level language such as Matlab, Python, C, C++, c#, JAVA, etc.) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies, networking technologies, and internetworking technologies. The computer program may be distributed in any form as a removable storage medium with accompanying printed or electronic documentation (e.g., shrink wrapped software or a magnetic tape), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Embodiments of the present invention may be described, without limitation, by the following clauses. While these embodiments have been described in the clauses by process steps, an apparatus comprising a computer with associated display capable of executing the process steps in the clauses below is also included in the present invention. Likewise, a computer program product including computer executable instructions for executing the process steps in the clauses below and stored on a computer readable medium is included within the present invention.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method for characterizing a beam parameter associated with an electromagnetic beam of a source, the method comprising:

a. exposing a substrate with the electromagnetic beam via a phase-shifted target through a set of focal distances relative to a focal plane of the substrate;
   b. at each focal distance of the set, determining an x-registration value and a y-registration value;
   c. using the x-registration value and the y-registration value at each focal distance to determine an x-registration slope and a y-registration slope as a function of focal distance; and
   d. comparing the x-registration slope and the y-registration slope with a baseline x-registration slope and a baseline y-registration slope, respectively, in such a manner as to characterize a relative value of the beam parameter.

2. A method in accordance with claim 1, wherein the beam parameter is a relative degree of polarization.

3. A method in accordance with claim 2, wherein the polarization is linear.

4. A method in accordance with claim 1, wherein the beam parameter is chosen from a group of beam parameters including degree of polarization, polarization rotation, orientation of an optical axis, and number of active space transverse modes.

5. A method in accordance with claim 1, wherein the source is a laser.

6. A method in accordance with claim 1, wherein the source is an EUV source.

7. A method in accordance with claim 1, wherein the source is incorporated within a lithography tool.

* * * * *